United States Patent [19]

Campbell et al.

[11] Patent Number: 5,087,582
[45] Date of Patent: Feb. 11, 1992

[54] MOSFET AND FABRICATION METHOD

[75] Inventors: Richard N. Campbell, Cwmbran; Michael K. Thompson, Newport; Robert P. Haase, Cwmbran, all of United Kingdom

[73] Assignee: Inmos Limited, Bristol, England

[21] Appl. No.: 396,844

[22] Filed: Aug. 21, 1989

[30] Foreign Application Priority Data

Aug. 24, 1988 [GB] United Kingdom ............... 8820058

[51] Int. Cl.$^5$ ........................................ H01L 21/265
[52] U.S. Cl. ........................................ 437/41; 437/40; 437/44; 437/57; 437/60
[58] Field of Search ............... 437/40, 44, 60, 57, 437/41

[56] References Cited

U.S. PATENT DOCUMENTS

| 4,642,878 | 2/1987 | Maeda | 29/571 |
| 4,757,026 | 7/1988 | Woo et al. | 437/44 |
| 4,764,477 | 8/1988 | Chang et al. | 437/29 |
| 4,843,023 | 6/1989 | Chiu et al. | 437/34 |

FOREIGN PATENT DOCUMENTS

| 0216053 | 4/1987 | European Pat. Off. | |
| 0218408 | 4/1987 | European Pat. Off. | 437/44 |
| 0290176 | 12/1987 | Japan | 437/40 |

Primary Examiner—Brian E. Hearn
Assistant Examiner—Kevin M. Picardat
Attorney, Agent, or Firm—Edward D. Manzo

[57] ABSTRACT

A method of fabricating a MOSFET wherein sidewall spacers are provided adjacent the gate of the MOSFET, the method including the steps of providing an insulating layer which extends over the source, drain and gate of the MOSFET and which acts as an impurity diffusion barrier; and forming on the insulating layer sidewall spacers which are composed of an insulating material.

3 Claims, 3 Drawing Sheets

MOSFET AND FABRICATION METHOD

BACKGROUND OF THE INVENTION

The present invention relates to a method of fabricating a MOSFET, and in particular a lightly doped drain MOSFET. More particularly, the present invention relates to a method of fabricating complementary self-aligned MOSFETs wherein a lightly doped drain n-channel device is complementarily arranged with either a zero drain overlap p-channel device or a lightly doped drain p-channel device.

It is widely known that conventional drain structure n-channel MOS devices can become unreliable at shorter channel lengths due to hot carrier effects. One way to overcome this problem is to modify the conventional drain structure such that the peak electric field at the drain edge is reduced. This can be achieved by reducing the drain doping density at the drain edge to produce a lightly doped drain (LDD) structure in the NMOS device. The LDD structure in the NMOS device may be formed by employing a sidewall spacer of silicon dioxide on the gate material.

In a typical known process to form n-channel LDD MOSFETs in a CMOS technology, n- and p-type wells are defined in silicon and are isolated by isolation oxide. The gate oxide is then formed and polysilicon gate electrodes are then patterned on the gate electrode oxide. The gate material and the sources and drains are then oxidized to grow 300–500 Å of silicon dioxide. The p-type silicon layers are then masked off and p+ dopant is then implanted into the p-channel sources and drains. The mask is stripped off and then n-dopant is implanted into the entire device. A layer of silicon dioxide 2000–3000 Å thick is deposited over the device and then the silicon dioxide is anisotropically etched back to form oxide sidewall spacers on the gate electrodes material. A layer of silicon dioxide up to 400 Å thick is grown on the source/drain areas. The n-type silicon areas are masked off and n+dopant is implanted into the n-channel sources and drains. The device processing is completed through the formations of contacts and metallization. One difficulty in employing the known sidewall spacer technology in the manufacture of an LDD n-channel device in such a CMOS fabrication process is that the p-channel device must be masked during the LDD processing since the LDD implant penetrates all unmasked areas of the CMOS device being fabricated. Accordingly, an extra masking layer is required to protect areas of the CMOS device other than the n-channel device sources and drains.

An alternative process is described in "LDD MOSFETs Using Disposable Sidewall Spacer Technology" by James R. Pfiester, *IEEE Electron Device Letters*, Vol. 9, No. 4, April 1988. This paper discloses the fabrication of LDD MOSFET devices wherein the disposable sidewall spacers are provided on a thin polysilicon buffer layer which covers an oxidized polysilicon gate. The same masks can be used for both the light and heavy source/drain implants. However, the polysilicon buffer layer must be removed. Consequently, all of the sidewall spacers must also be removed. This is a serious disadvantage when the process is applied to devices which incorporate areas within the gate layer which are not intended to receive drain implants, such as SRAM cell loads as disclosed in, for example, U.S. Pat. No. A-4,471,374 and EP-A-0,197,871. If the polysilicon buffer layer is removed by thermal oxidation, this causes the growth of an oxide layer, typically 600–700Å thick, on the device which can block the source/drain implants.

EP-A-0218408 discloses a process for forming an LDD structure in integrated circuits which employs a two layer side wall spacer technology. The disclosed process is similar to that disclosed in the Pfiester article in that it employs a layer of LPCVD polysilicon to form side wall spacers, but this results in process limitations.

GB-A-2106315 discloses the manufacture of FETs in which sides of a polysilicon gate and line are oxidized. EP-A-0187260 discloses a MOSFET having an LDD-structure. EP-A-0111706 discloses a sidewall isolation for a gate of a field effect transistor. U.S. Pat. No. 4,729,002 discloses a semiconductor device provided with a MOSFET.

The present invention aims to overcome the above-mentioned problems of the prior art.

SUMMARY OF THE INVENTION

The present invention provides a method of fabricating a MOSFET wherein sidewall spacers are provided adjacent the gate of the MOSFET, the method including the steps of providing an insulating layer which extends over the source, drain and gate electrode of the MOSFET and which acts as an impurity diffusion barrier; and forming on the insulating layer sidewall spacers which are composed of an insulating material.

The present invention further provides a method of fabricating a MOSFET, which method includes the steps of:

(a) providing a gate for a MOSFET on an oxide layer which extends over a region of silicon doped with an impurity of one conductivity type:

(b) forming on the gate and adjacent exposed portions of the oxide layer an insulating layer which acts as a barrier to diffusion of impurities in silicon;

(c) forming a second oxide layer over the insulating layer;

(d) anisotropically etching the second oxide layer to provide sidewall spacers of the etchable layer on the insulating layer and adjacent the gate; and (e) implanting a dopant impurity of a second conductivity type into the region of silicon, the sidewall spacers acting to mask portions of the region which are located under the sidewall spacers.

The present invention further provides a method of fabricating complementary p-channel and n-channel MOSFETS, the method comprising the steps of:

(a) providing gates for complementary p-channel and n-channel MOSFETS, each gate being located on a respective oxide layer which extends over a respective region of silicon doped with respectively, an n- or p-type impurity, the gates being separated by a region of isolation oxide:

(b) forming on the gates and the adjacent exposed portions of the oxide layer an insulating layer which acts as a barrier to diffusion of impurities in silicon:

(c) forming over the insulating layer an etchable layer composed of an insulating material; and (d) anisotropically etching the etchable layer to provide sidewall spacers of the etchable layer on the insulating layer and adjacent the gates;

wherein the n-channel MOSFET is a lightly doped drain MOSFET and is fabricated by steps (e) to (i):

(f) implanting an n+ type dopant impurity into the unmasked p-region of silicon, the sidewall spacers in the p-region acting to mask portions of the p-region which are located under the said sidewall spacers;

(g) isotropically etching the said sidewall spacers from the insulating layer;

(h) implanting an n- type dopant impurity into the said portions of the p-region; and (i) unmasking the n-region of silicon; and wherein the p-channel MOSFET is fabricated either before or after the n-channel MOSFET by steps (j) to (l):

(j) masking the p-region of silicon;

(k) implanting a p+ type dopant impurity into the unmasked n-region of silicon, the sidewall spacers in the n-region acting to mask portions of the n-region which are located under the said sidewall spacers; and (l) unmasking-the p-region of silicon.

The present invention further provides a semiconductor device including complementary MOSFETS comprising a lightly doped drain n-channel MOSFET and a zero drain overlap p-channel MOSFET, each MOSFET having an insulating layer extending over the source, drain and gate thereof, the insulating layer acting as an impurity diffusion barrier.

BRIEF DESCRIPTION OF THE DRAWINGS

Embodiments of the present invention will now be described by way of example only with reference to the accompanying drawings in which.

DETAILED DESCRIPTION OF THE PREFERRED EMBODIMENTS

Figure 1:
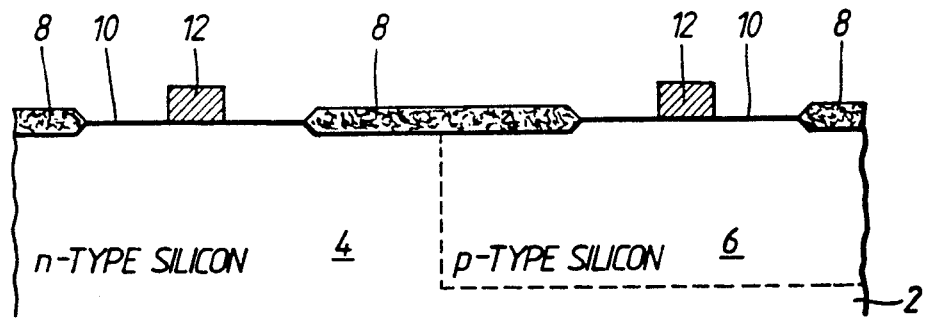
FIG. 1 shows diagrammatically a section through a silicon wafer structure in a CMOS process after polysilicon gate electrodes have been deposited onto a gate oxide layer which covers wells between regions of isolation oxide.

Referring to the drawings, FIG. 1 shows a silicon structure after four steps in a conventional CMOS process to form CMOS gate electrodes on a gate oxide layer, these steps being initially employed in the method of the present invention. A layer of silicon 2 is provided in which an n-type well 4 and a p-type well 6 are defined by n-and p-dopant implantation respectively. Regions 8 of isolation oxide are grown on the silicon layer 2 and a gate oxide layer 10 is formed over the silicon layer 2 between the isolation oxide regions 8. Subsequently, polysilicon gate electrodes 12 are formed on the gate oxide layer 10 and then subsequently doped with an n-dopant. All of these steps are employed in conventional CMOS processing. The process steps are independent of the choice of CMOS structure, which may be n-well, twin well, or p-well, although the drawings illustrate a CMOS structure having n- and p-wells. It should be also understood that although the drawings illustrate only one complementary pair of CMOS devices, an array of such devices may be fabricated in accordance with the present invention on a single silicon substrate. The gate electrode material may be varied provided that it is compatible with the subsequent deposition and etch processes required by the method of the present invention. Typically, n- or p-type polysilicon, a silicide, or polycide could be used interchangeably.

Figure 2:
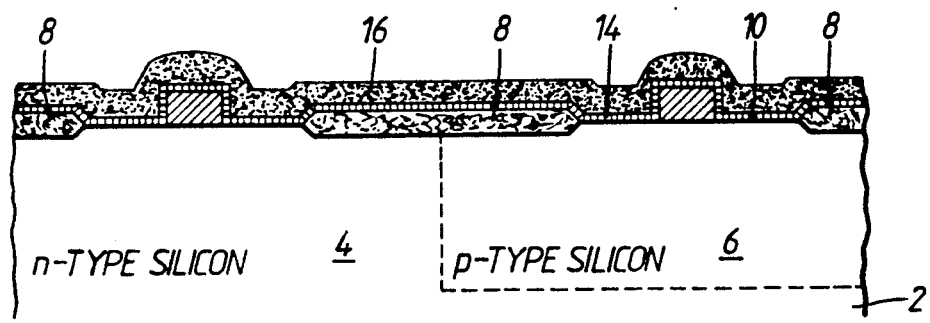
FIG. 2 shows the structure of FIG. 1 after the successive deposition of an insulating barrier layer and a layer of oxide over the structure.

Referring to FIG. 2, an insulating barrier layer 14 is deposited over the structure. In the illustrated embodiment, the insulating barrier layer 14 is composed of silicon nitride, which typically has a thickness of 200 –400Å. The insulating barrier layer 14 acts as a barrier to dopant impurities. A silicon oxide layer 16 is then deposited over the silicon nitride layer 14 and typically has a thickness of 2000 –4000Å.

Figure 3:
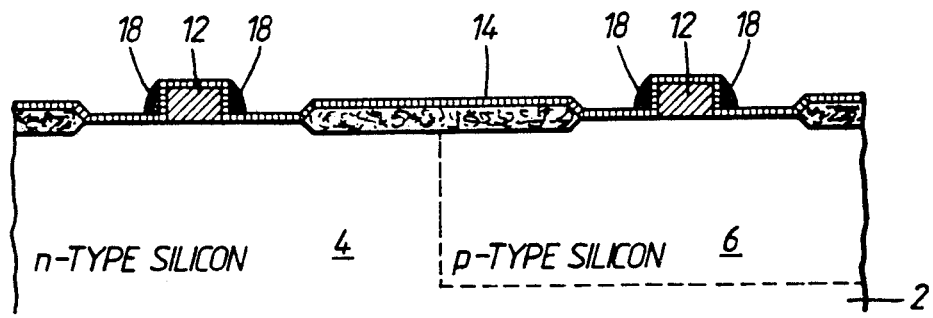
FIG. 3 shows the structure of FIG. 2 after anisotropic etching of the oxide to form sidewall spacers.

As is shown in FIG. 3, the oxide layer 16 is then anisotropically etched back to the nitride layer 14 to form sidewall spacers 18 on the gates 12. The etch back of the oxide layer 16 can be carried out by any plasma etch system capable of anisotropically etching oxide with a selectivity to nitride of greater than 3:1.

Figure 4:
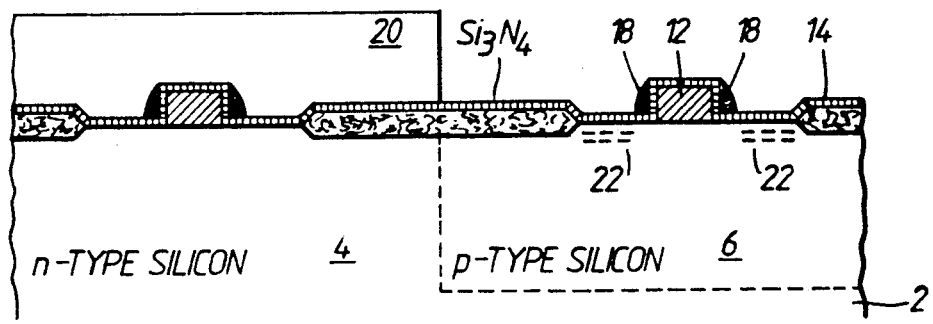
FIG. 4 shows the structure of FIG. 3 after application of a mask to the n-type silicon areas and after subsequent implantation of the n+ sources and drains.

FIG. 4 shows the resultant structure after the n-type silicon areas have been masked off by a photoresist layer 20 and then n+ sources and drains 22 have been implanted into those areas of the p-type silicon which are not masked by the gates 12, the sidewall spacers 18 or the isolation oxide regions 8. The sidewall spacers 18 act to mask from n+ dopant implantation the p-type silicon adjacent the gates 12.

Figure 5:
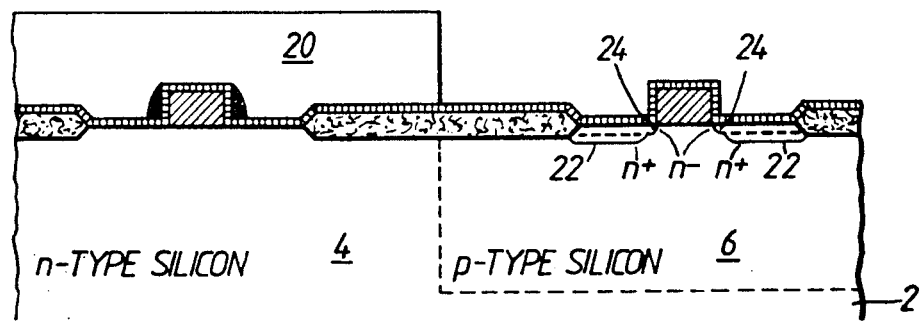
FIG. 5 shows the structure of FIG. 4 after removal of the sidewall spacers over the p-type silicon and subsequent implantation of n- lightly doped drains.

Turning now to FIG. 5, the sidewall spacers 18 in the p-type silicon areas are isotropically etched by being dipped off in a wet etchant such as a buffered hydrofluoric acid solution. The n− lightly doped drains 24 are then formed by implanting n− dopant into unmasked areas of the structure and in particular into those areas 24 of the p-type silicon which were previously masked by the sidewall spacers 18.

Figure 6:
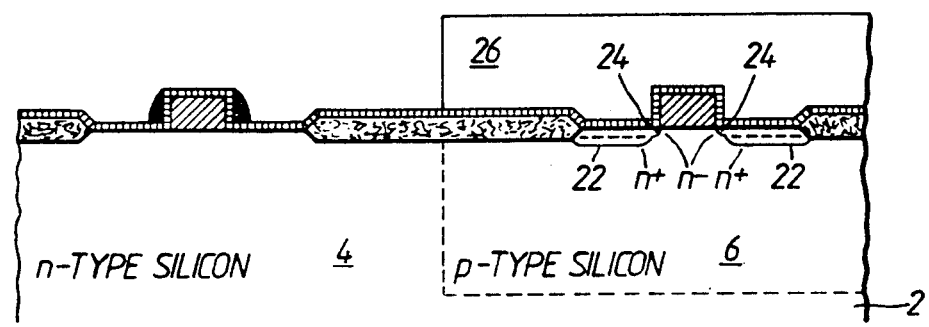
FIG. 6 shows the structure of FIG. 5 after removal of the mask of the n-type silicon areas and after subsequent application of a mask to the p-type silicon areas.

As is shown in FIG. 6, the photoresist layer 20 over the n-type silicon is then stripped off and a second photoresist layer 26 is applied as a mask over the p-type silicon.

Figure 7:
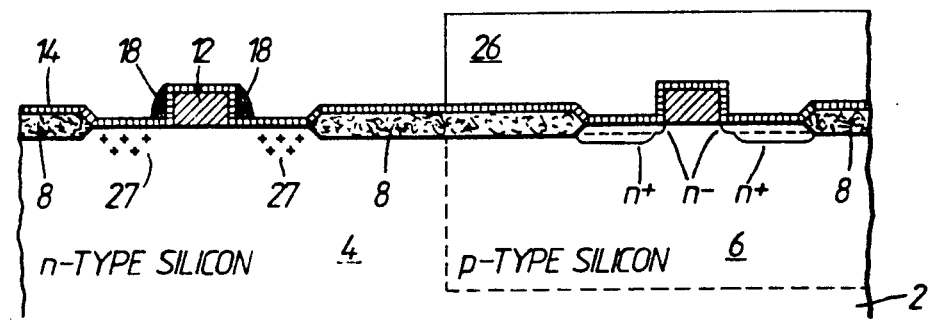
FIG. 7 shows the structure of FIG. 6 after implantation of the p+sources and drains.

FIG. 7 shows the resultant structure after implantation of the p+sources and drains into those areas 27 of the n-type silicon which are not masked by the gate electrodes 12, the sidewall spacers 18 or the isolation oxide regions 8. The sidewall spacers 18 act to mask from p+ dopant implantation the n-type silicon adjacent the gate electrodes 12.

Figure 8:
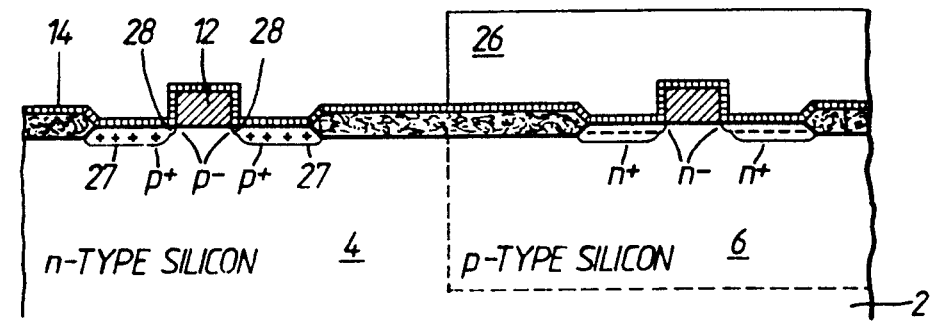
FIG. 8 shows the structure of FIG. 7 after removal of the sidewall spacers over the n-type silicon and subsequent implantation of p- lightly doped drains.
Figure 9:
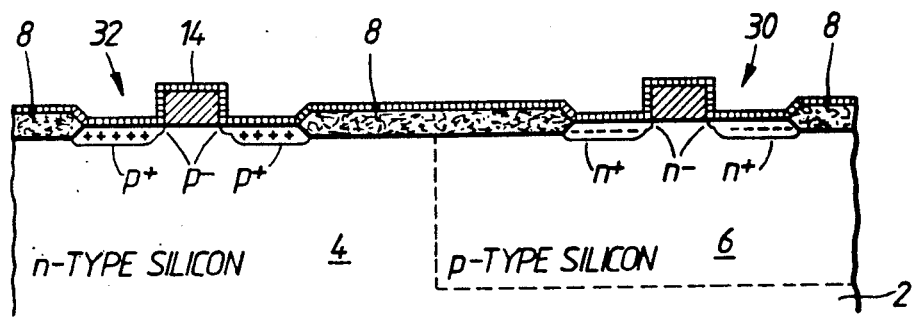
FIG. 9 shows the structure of FIG. 8 after removal of the mask of the p-type silicon areas to provide a CMOS structure having LDD p- and n-channel devices.
Figure 10:
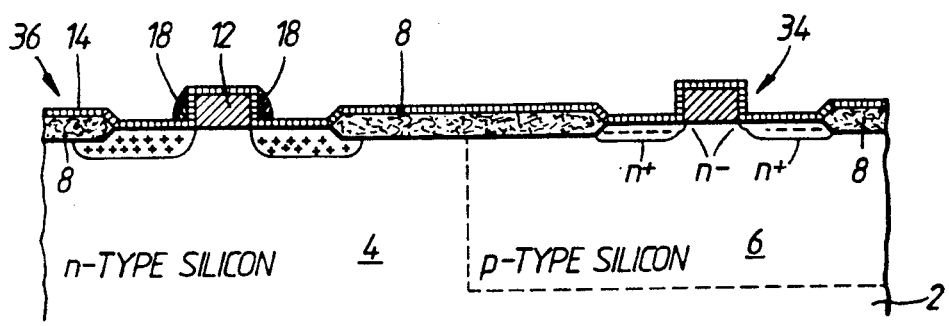
FIG. 10 illustrates an alternative embodiment of the present invention wherein the mask of the p-type silicon areas has been removed directly from the structure of FIG. 7 to provide a CMOS structure having LDD n-channel devices and zero drain overlap (ZDO) p-channel devices following subsequent activation and diffusion of the implants.

FIGS. 8 and 9 show the subsequent steps of the method in accordance with a first embodiment of the present invention and FIG. 10 shows the subsequent step of the method in accordance with a second embodiment of the present invention.

FIG. 8 shows the structure of FIG. 7 following removal of the sidewall spacers 18 by isotropic etching in the manner described hereinabove and subsequent p− dopant implantation into unmasked areas of the structure and in particular into those areas 28 of the n-type silicon which were previously masked by the sidewall spacers 18. The p− dopant implantation forms p− lightly doped drains 28.

FIG. 9 shows the final structure after the second photoresist layer 26 has been stripped off. The final structure consists of both n- and p-channel LDD MOSFETS 30,32.

An alternative embodiment is illustrated by FIG. 10 which shows the structure of FIG. 7 following direct removal of the second photoresist layer 26 from the p-type silicon. The final structure consists of n-channel LDD MOSFETS 34 and ZDO (zero drain overlay) conventional drain p-channel MOSFETS 36 following diffusion of the p+implant.

For both of the illustrated embodiments of the invention, doped glass (not illustrated) is deposited over the final structure and metallized connections made through the glass to the gate, source and drain of the MOSFETS.

It will be seen that the method of the present invention permits LDD CMOS structures to be fabricated by using only a single mask for the LDD regions, but it also allows the option of leaving the sidewall spacers in place on the p-channel devices to provide ZDO conventional drain p-channel devices. In addition, the spacers can be left in place when it is desired to incorporate other circuit elements, e.g. static RAM resistive loads, into the CMOS structure by masking those elements with both resist masks 20 and 26. These masks protect those elements from all of the source/drain and LDD implants.

Figure 11:
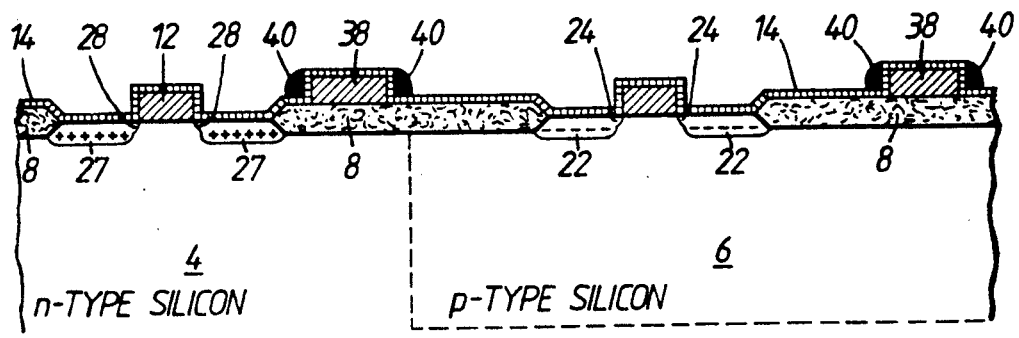
FIG. 11 shows a further alternative embodiment of the present invention wherein resistors are incorporated into a CMOS structure having LDD p- and n- channel devices.

FIG. 11 illustrates a further embodiment have a structure, similar to that of FIG. 9, wherein n- and p- channel LDD MOSFETs 30,32 have been fabricated in combination with polysilicon resistors. Undoped polysilicon structures 38 are formed on the isolation oxide regions 8 before the deposition of the insulating barrier layer 14 of silicon nitride. The undoped polysilicon structures 38 are then covered in turn by the insulating barrier layer 14 and then the oxide layer 16 (see FIG. 2). The oxide layer 16 is then anisotropically etched as described hereinabove to form sidewall spacers 40 adjacent the polysilicon structures 38. During the subsequent processing steps to form the LDD MOSFETs as described hereinabove, the polysilicon structures 38, together with their associated sidewall spacers 40, are covered by the resist masks 20 and 26. Thus the polysilicon structures 38 do not receive any implants and hence they are able to serve as, for example, undoped polysilicon resistors of the type often used in static RAM cell loads. Since the polysilicon structures 38 are masked also during the isotropic etching step to remove the sidewall spacers 18 from the gates 12, in the final structure the sidewall spacers 40 remain on the polysilicon structures 38.

The insulating barrier layer, which is preferably silicon nitride, acts as an etch stop during etching of the oxide layer which forms the sidewall spacers. The insulating barrier layer must therefore be resistant to both the anisotropic etchants and the isotropic etchants used to etch the oxide layer. The insulating barrier layer acts as an impurity diffusion barrier layer to prevent impurities from the glass layer diffusing into the CMOS elements. This can prevent device instabilities. Also, the insulating barrier layer acts as a top protective layer for the CMOS structure and can protect the device surface from plasma damage. This provision can enhance device reliability.

The present invention can provide an advantage that the insulating barrier layer protects the oxide of parasitic devices from being thinned down during etching of the device. The parasitic devices may be those formed by oxide isolation techniques such as LOCOS or SILO.

In addition, the present invention can provide a further advantage that the gate (electrode) to light-doped drain overlap is reduced by the use of the silicon nitride layer. Since the nitride layer which is about 400 A thick, is disposed on the side of the gate electrode, this acts as a spacer and results in the lightly-doped drain being spaced about 400 A from the gate. This gives a diffusion distance between the gate and the lightly-doped drain whereby the LDD implant is required to diffuse in order to actuate the device.

The choice of materials in this invention allows complementary MOSFETs comprising LDD n-channel and ZDO- or LDD p-channel devices to be fabricated in conjunction with other elements such as polysilicon resistors without requiring any additional masks beyond the normal CMOS masking requirements.

The material of the sidewall spacers, preferably silicon oxide, must be capable of being both anisotropically and isotropically etched, the anisotropic etchant generally being a plasma and the isotropic etchant generally being a wet etchant.

As described hereinabove, the gate electrode material may be varied and is typically n- or p- type polysilicon, a silicide or polycide. Preferably, for the n-channel device, the gate electrode consists of n-type polysilicon. Sufficient n− dopant may have been incorporated into the polysilicon before the fabrication of the source and drain of the n-channel device or alternatively the n-dopant which is implanted into the gate during the n+ dopant implantation into the source and drain provides the requisite n− dopant in the gate. Preferably the p-channel device also has a polysilicon gate electrode, which may be n-type for a buried channel device or p-type for a surface channel device. For the buried channel device, the gate electrode initially has a high n-dopant concentration which is only slightly reduced during the p+ dopant implantation step. For the surface channel device, sufficient p−dopant may have been implanted into the polysilicon before the fabrication of the source and drain of the p- channel device or alternatively the p− dopant which is implanted into the gate electrode during the p+ dopant implantation into the source or drain provides the requisite p− dopant in the gate electrode.

What we claim is:

1. A method of fabricating complementary p-channel and n-channel MOSFETS, the method comprising the steps of:
    (a) providing gate electrodes for complementary p-channel and n-channel MOSFETS, each gate electrode being located on a respective oxide layer which extends over a respective region of silicon doped with respectively, an n- or p-type impurity, the gate electrodes being separated by a region of isolation oxide;

(b) forming on the gate electrodes and the adjacent exposed portions of the oxide layer an insulating layer which acts as a barrier to diffusion of impurities in silicon;

(c) forming over the insulating layer an etchable layer composed of an insulating material; and (d) anisotropically etching the etchable layer to provide sidewall spacers of the etchable layer on the insulating layer and adjacent the gate electrodes;

wherein the n-channel MOSFET is a lightly doped drain MOSFET and is fabricated by steps (e) to (i);

(e) masking the n-regions of silicon;

(f) implanting an n+ type dopant impurity into the unmasked p-region of silicon, the sidewall spacers in the p-region acting to mask against implantation portions of the p-region which are located under the said sidewall spacers;

(g) isotropically etching the said sidewall spacers from the insulating layer;

(h) implanting an n-type dopant impurity into the said portions of the p-regions; and (i) unmasking the n-region of silicon; and wherein the p-channel MOSFET is fabricated either before or after the n-channel MOSFET by steps (j) to (m);

(j) masking the p-region of silicon;

(k) implanting a p+ type dopant impurity into the unmasked n-region of silicon, the sidewall spaces in the n-region acting to mask against implantation portions of the n-region which are located under the said sidewall spaces;

(l) unmasking the p-region of silicon; and (m) diffusing the p+ implant towards the respective gate thereby to produce a zero drain overlap p-channel MOSFET.

2. The method of claim 1 wherein said p-channel MOSFET is fabricated with zero drain overlap without removing the sidewall spacers in the n-region, and wherein the implanted p+ impurity is diffused to locations under said sidewall spacers.

3. The method of claim 2 wherein said sidewall spacers comprise silicon oxide and wherein said insulating layer comprises silicon nitride.

* * * * *